US011815542B2

(12) United States Patent
Gaggl

(10) Patent No.: US 11,815,542 B2
(45) Date of Patent: Nov. 14, 2023

(54) DEVICE FOR TESTING COMPONENTS UNDER ELEVATED GAS PRESSURE

(71) Applicant: Rainer Gaggl, Drobollach (AT)

(72) Inventor: Rainer Gaggl, Drobollach (AT)

(*) Notice: Subject to any disclaimer, the term of this patent is extended or adjusted under 35 U.S.C. 154(b) by 258 days.

(21) Appl. No.: 17/299,165

(22) PCT Filed: Jan. 13, 2020

(86) PCT No.: PCT/EP2020/050673
§ 371 (c)(1),
(2) Date: Jun. 2, 2021

(87) PCT Pub. No.: WO2020/148226
PCT Pub. Date: Jul. 23, 2020

(65) Prior Publication Data
US 2022/0034955 A1     Feb. 3, 2022

(30) Foreign Application Priority Data
Jan. 14, 2019    (AT) .................................. A 10/2019

(51) Int. Cl.
*G01R 31/26*    (2020.01)
*G01R 1/073*    (2006.01)

(52) U.S. Cl.
CPC ..... *G01R 31/2601* (2013.01); *G01R 1/07314* (2013.01); *G01R 31/2644* (2013.01)

(58) Field of Classification Search
CPC ............ G01R 31/2601; G01R 31/2644; G01R 1/07314
See application file for complete search history.

(56) References Cited

U.S. PATENT DOCUMENTS

2012/0074976 A1    3/2012    Durbin et al.

FOREIGN PATENT DOCUMENTS

| AT | 511 058 | 9/2012 |
|---|---|---|
| AT | 511 226 | 3/2013 |
| AT | 14209 | 6/2015 |
| AT | 14210 | 6/2015 |
| EP | 2 824 467 | 1/2015 |
| JP | 2018-160591 | 10/2018 |
| JP | 2018-160592 | 10/2018 |

OTHER PUBLICATIONS

English Translation of AT 511058 B1 (Year: 2012).*
Search Report for Austrian Application No. 10/2019 dated Dec. 5, 2019, 1 page.
International Search Report and Written Opinion of the ISA for PCT/EP2020/050673 dated Apr. 20, 2020, 12 pages.

* cited by examiner

*Primary Examiner* — Paresh Patel
(74) *Attorney, Agent, or Firm* — NIXON & VANDERHYE

(57) ABSTRACT

Disclosed is a device for testing components under elevated pressure in which a pressure chamber is provided. The lateral boundary of the pressure chamber included a ring and an annular part, which may move perpendicularly to the plane of the component to be tested. A velvet-like lining is provided on the end face of the annular part or of the ring that faces the component to be tested. The fibers of the lining protrude from the annular part or from the ring toward the component to be tested and bridge the gap between the device and the component.

15 Claims, 1 Drawing Sheet

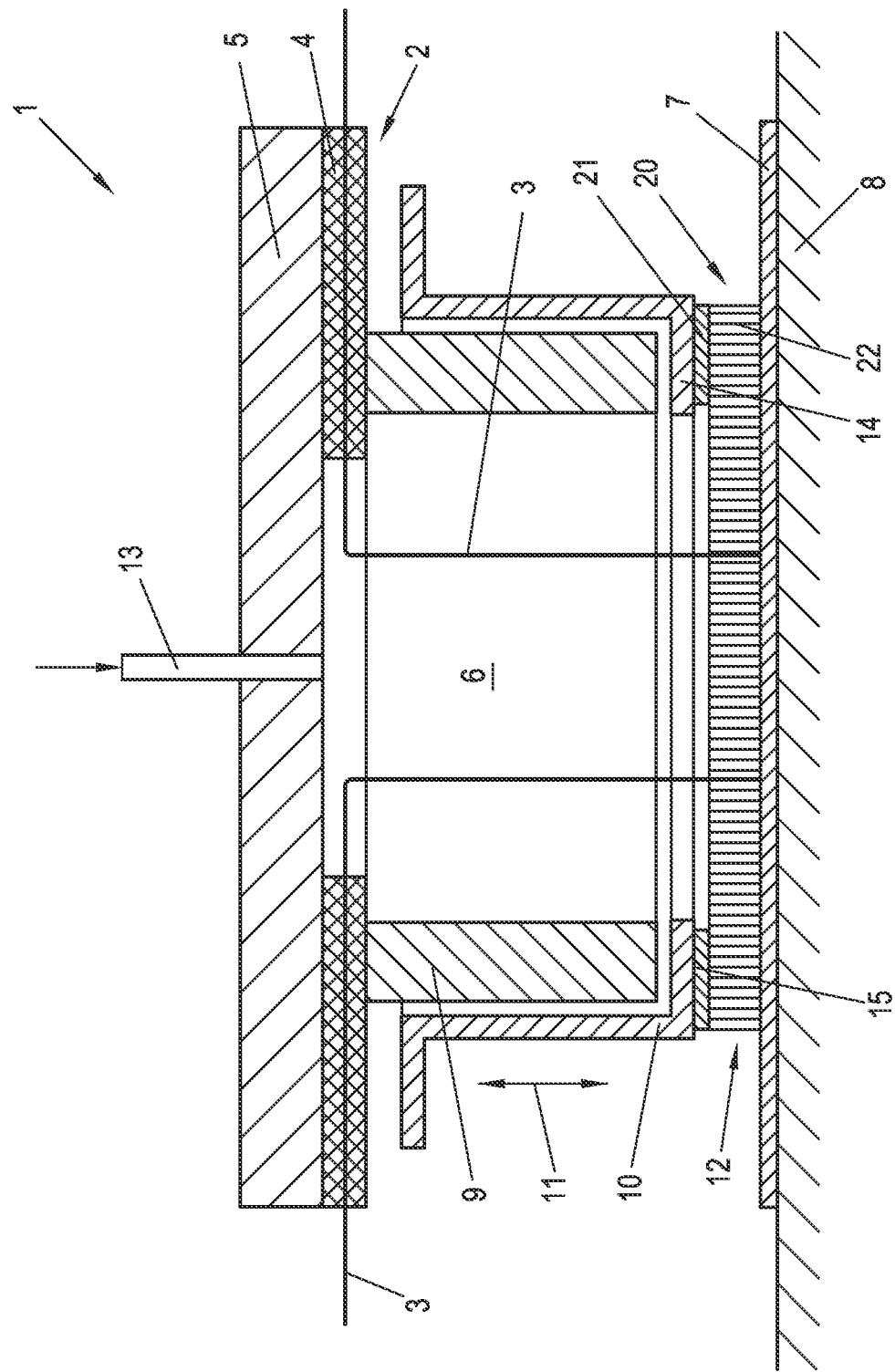

US 11,815,542 B2

DEVICE FOR TESTING COMPONENTS UNDER ELEVATED GAS PRESSURE

This application is the U.S. national phase of International Application No. PCT/EP2020/050673 filed Jan. 13, 2020 which designated the U.S. and claims priority to AT Patent Application No. A 10/2019 filed Jan. 14, 2019, the entire contents of each of which are hereby incorporated by reference.

BACKGROUND OF THE INVENTION

Field of the Invention

The invention relates to a device for testing electrical/electronic components under elevated gas pressure.

Description of the Related Art

Such devices are known.

For example, AT 14209 U1 shows a device for testing semiconductor components, in which a needle card carries a pressure chamber. The pressure chamber is bounded by a movable sealing ring on its open end that is assigned to a semiconductor component that is to be tested. The sealing ring is held at a defined distance from the semiconductor component by the Bernoulli Effect, which is produced by compressed gas that flows from the pressure chamber through the gap between the sealing ring and the semiconductor component.

A device for avoiding flashovers during high-voltage testing of semiconductor components (chips) on semiconductor wafers is known from AT 511 226 B1. The known device comprises a pressure chamber with a compressed gas feed that can deliver the semiconductor wafer in a sealing manner, so that the inside space of the pressure chamber is placed under overpressure and thus the firing voltage for a flashover between contact surfaces is greater than the maximum test voltage to be applied. The pressure chamber is connected to a needle card with contact needles. The pressure chamber has a movable part that can move relative to the parts of the pressure chamber that are connected to the needle card. The movable part of the pressure chamber, which is formed as a ring seal, is held at a distance from the surface of the semiconductor wafer in a sealing manner by an air bearing in the gap between the pressure chamber and the semiconductor wafer, wherein at least one spring is provided between the part of the pressure chamber that is connected to the needle card and the movable part of the pressure chamber.

A method and a device for testing pressure sensors, in particular pressure sensor chips, of a semiconductor wafer are known from AT 511 058 B1. For electrical and pneumatic testing of pressure sensors, in particular pressure sensor chips, of a semiconductor wafer, the semiconductor wafer makes electrical contact and is placed under a defined overpressure in a pressure chamber, wherein the overpressure that places a load on the semiconductor wafer is detected by a reference pressure sensor. The pressure chamber is arranged on a needle card with test needles and has a part that can be moved relative to the needle card. An air bearing is formed between the end face of the movable part of the pressure chamber that faces the semiconductor wafer and the semiconductor wafer. The known method allows pressure sensor chips of a semiconductor wafer to be tested under defined conditions, wherein the testing is possible not only at a defined pressure, but also in the case of pressure fluctuations in the acoustic range.

Devices equipped with test needles for testing semiconductor components, wherein the devices have pressure chambers, are known.

EP 2 824 467 A1 thus describes a testing device with needles and a pressure chamber, wherein a system for preventing sparking (arcing) is provided. This system comprises an annular projection (FIG. 9), which is to consist of insulation material (synthetic resin). EP 2 824 467 A1 does not make any reference to fibers.

JP 2018160591 A1 shows and describes a pressure chamber for a testing device with a movable ring. JP 2018160591 A1 does not make any reference to fibers.

US 2012/0074976 A1 relates to a system for testing wafers, wherein a vacuum testing chamber is provided, which is bounded laterally by a sealing ring. Also, the "vacuum chuck" for handling wafers, in order to move the latter from and to the testing device, comprises a sealing ring, as is shown in, e.g., FIG. 4b. The oblique lines that are provided in FIG. 4b in the lower area of the "chuck" are not mentioned in the description, so that it must be assumed that these are not fibers that laterally bound a pressure chamber.

It is problematic in the known devices of the type mentioned at the beginning that gas from the pressure chamber exits through the gap between the device and the component that is to be tested, so that it is not easy to maintain the desired elevated pressure in the pressure chamber.

Another drawback consists in that solid particles can move in the gap and damage the component that is to be tested there, for example by scratching. It is especially disruptive if there are solid particles in the gap when the device is being brought into position and/or said solid particles become embedded in the component that is to be tested and/or in the end face of an annular part that laterally bounds the pressure chamber and adhere to the part.

SUMMARY OF THE INVENTION

The object of the invention is to improve the known devices to the extent that the above-described problems are avoided.

This object is achieved according to the invention with a device that has the features disclosed.

Preferred and advantageous configurations of the device according to the invention are also disclosed.

Since, in the case of the device according to the invention, fibers are provided on the end face facing the component that is to be tested, where this is the end face of the lateral boundary of the pressure chamber, for example a ring or an annular part that laterally bounds the pressure chamber, solid particles are kept from entering the gap.

In addition, in an embodiment of the device according to the invention, the advantage results that when the arrangement of fibers is of a certain density, gas is prevented from escaping from the pressure chamber.

In a preferred embodiment of the invention, the fibers are oriented essentially perpendicular to the plane of the end face of the lateral boundary of the pressure chamber, in particular of the ring or the annular part that bounds the pressure chamber, and in particular components of a velvet-like lining, which is arranged on (fastened to) the end face of the lateral boundary of the pressure chamber.

Additional details and features of the device according to the invention are given in the description below of an embodiment that is depicted diagrammatically and in section in the accompanying drawing.

BRIEF DESCRIPTION OF THE DRAWING

The sole drawing illustrates a cross-sectional view of the device.

DESCRIPTION OF THE PREFERRED EMBODIMENTS

A device 1 for testing electrical and/or electronic components, such as, for example, conductor components, in particular in the form of wafers with chips or pressure sensors, in particular pressure sensor chips, which are provided on a semiconductor wafer, comprises a needle card 2 with test needles 3, which are embedded in a plastic mass 4 that is provided on a base plate 5 of the needle card 2.

The device 1 comprises a pressure chamber 6, which is bounded on the side of the base plate 5 that faces away from the component 7 that is to be tested, which component 7 rests on a carrier 8. The lateral boundary of the pressure chamber 6 is formed by a ring 9. An annular part 10 ("sealing ring") is provided outside on the ring 9. The annular part 10 can move (can slide) relative to the ring 9 in the direction of the double arrow 11. The guiding of the annular part 10 on the ring 9 can be designed in principle in the way known from AT 511 058 B1 or AT 511 226 B1.

Gas that is introduced into the pressure chamber 6 via a line 13 ensures that not only is elevated pressure generated in the pressure chamber 6 but also that a gas bearing is formed in the gap 12 between the component 7 that is to be tested and a (flangelike) ring part 14 that points inward (toward the pressure chamber 6) of the movable annular part 10.

On the end face 15 facing the component 7 that is to be tested, where this is the end face of the ring part 14 of the movable annular part 10, a velvet-like lining 20, which can be, for example, annular, is provided. The velvet-like lining 20, which covers, for example, the entire (annular) end face 15 of the ring part 14 of the annular part 10, comprises a carrying area 21 and fibers 22, which are oriented, on the one hand, essentially perpendicular to the component 7 that is to be tested and, on the other hand, to the end face 15 of the annular part 10. As can be seen from the diagrammatic FIGURE of the drawings, the fibers 22 extend up to the surface, facing the device 1, of the component 7 that is to be tested.

Although the invention has been described based on an embodiment with an annular part 10, which is arranged to move on the ring 9 that laterally bounds the pressure chamber 6, this movable annular part 10 does not necessarily have to be provided.

In addition, an embodiment of the device according to the invention is taken into consideration, in which the annular part 10 is arranged in a non-movable manner relative to the ring 9 that laterally bounds the pressure chamber 6, i.e., is arranged snugly and non-movably on the ring 9.

When the annular part 10 is not movable, the annular part 10 can also be made integral with the ring 9.

In the embodiments without the movable annular part 10, the fibers 22 are provided on the end face of the ring 9 that faces the component 7 that is to be tested.

When the annular part 10 is not movable or is not made integral with the ring 9, there is no gas bearing in the gap 12.

A tight arrangement of the fibers 22 of the velvet-like lining 20 ensures that the outflow of gas that is fed to the pressure chamber 6 via the line 13 through the gap 12 is prevented, so that the build-up of pressure in the pressure chamber 6 can take place without major loss of gas.

In addition, the fibers 22 prevent solid particles from penetrating into the gap 12 between the device 1 and the component 7 that is to be tested (semiconductor wafer) and there cause the damage that was described in the beginning.

Another more advantageous effect of the device according to the invention also consists in the following: if (smaller) particles should penetrate into the gap 12, these particles can slide between fibers 22 and are held by the fibers 22 so that they do not exert any pressure on the component 7 that is to be tested (test piece).

In a preferred embodiment, the fibers 22 have a length that corresponds to the size of the gap 12, for example a length of between 300 and 500 micrometers.

In summary, an embodiment of the invention can be described as follows:

In a device 1 for testing components under elevated pressure, a pressure chamber 6 is provided, wherein the lateral boundary of the pressure chamber 6 has a ring 9 and an annular part 10, which can be moved perpendicular to the plane of the component 7 that is to be tested. A velvet-like lining 20, whose fibers 22 project from the annular part 10 or from the ring 9 toward the component 7 that is to be tested and bridge the gap 12 between the device 1 and the component 7, is provided on the end face 15 facing the component 7 that is to be tested, where this is the end face of the annular part 10, or the ring 9.

The invention claimed is:

1. A device (1) for testing electrical/electronic components (7) under elevated gas pressure with a pressure chamber (6), which is provided with test needles (3) on a needle card (2), wherein a lateral boundary of the pressure chamber (6), which has at least one ring (9), is provided, and wherein there is a gap (12) between the component (7) that is to be tested and the lateral boundary of the pressure chamber (6), wherein fibers (22) are provided on the end face facing the component (7) that is to be tested, where this is the end face of the lateral boundary of the pressure chamber (6),
wherein the fibers (22) are arranged to prevent the flow of gas from the pressure chamber (6),
wherein an annular part (10) is provided on the ring (9) on a side of the ring that faces away from the pressure chamber (6),
wherein the annular part (10) is guided to move on the ring (9) relative to the needle card (2),
wherein the annular part (10) is fixed on the ring (9), and wherein the fibers (22) are arranged on the annular part (10).

2. The device according to claim 1, wherein the fibers (22) are oriented essentially perpendicular to the plane of the end face of the lateral boundary of the pressure chamber.

3. The device according to claim 2, wherein the fibers (22) are components of a velvet-like lining (20).

4. The device according to claim 1, wherein the fibers (22) are components of a velvet-like lining (20).

5. The device according to claim 1, wherein the fibers (22) have a length of between 300 and 500 micrometers.

6. The device according to claim 1, wherein the free ends of the fibers (22), lying separate from the lateral boundary of the pressure chamber (6), adjoin the component (7) that is to be tested.

7. The device of claim 6, wherein the ends of the fibers (22), lying separate from the lateral boundary of the ring (9), adjoin the component (7) that is to be tested.

8. The device according to claim 1, wherein the fibers (22) are arranged on the end face (15) facing the component (7) that is to be tested, where this is the end face of the ring part (14) of the annular part (10).

9. The device according to claim 1, wherein the fibers (22) are parts of the velvet-like lining (20), and wherein the velvet-like lining (20) is arranged on the end face (15) of the annular part (10).

10. The device according to claim 9, wherein the velvet-like lining (20) is arranged on the end face (15) facing the component (7) that is to be tested, where this is the end face of the ring part (14) of the annular part (10).

11. The device according to claim 10, wherein the velvet-like lining (20) has the shape of a circular wafer.

12. The device according to claim 11, wherein the circular wafer formed from the velvet-like lining (20) essentially covers the end face of the ring (9) or the end face (15) of the ring part (14) of the annular part (10).

13. The device according to claim 1, wherein the device (1) is set up for pneumatic testing of components (7), which are pressure sensors of a semiconductor wafer.

14. The device according to claim 1, wherein the device (1) is set up for electrical testing of components (7), which are semiconductor components.

15. The device of claim 1, wherein the annular part has a ring part that points inward.

\* \* \* \* \*